United States Patent
Unrein et al.

(10) Patent No.: US 6,324,075 B1
(45) Date of Patent: Nov. 27, 2001

(54) PARTIALLY COVERED MOTHERBOARD WITH EMI PARTITION GATEWAY

(75) Inventors: Edgar J. Unrein, Stellacoom; Minh T. Le, Olympia; Chris H. Hanes, Olympia; Ron D. Egger, Olympia, all of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/459,442

(22) Filed: Dec. 20, 1999

(51) Int. Cl.$^7$ ........................................... H05K 9/00
(52) U.S. Cl. .................. 361/816; 361/800; 361/818; 361/796; 174/35 R
(58) Field of Search .................. 361/683, 752, 361/753, 687–692, 706, 800, 796, 816, 818; 174/35 R (56) References Cited

U.S. PATENT DOCUMENTS

| | | | |
|---|---|---|---|
| 5,136,468 | * 8/1992 | Wong et al. | 361/393 |
| 5,153,379 | * 10/1992 | Guzuk et al. | 174/35 R |
| 5,224,019 | * 6/1993 | Wong et al. | 361/393 |
| 5,671,120 | * 9/1997 | Kikinisi | 361/687 |
| 5,928,076 | * 7/1999 | Clements et al. | 454/184 |
| 6,018,125 | * 1/2000 | Collins et al. | 174/35 R |
| 6,058,022 | * 5/2000 | Gianni et al. | 361/794 |

* cited by examiner

*Primary Examiner*—Jeffrey Gaffin
*Assistant Examiner*—Tuan Dinh
(74) *Attorney, Agent, or Firm*—Mark V. Seeley (57) ABSTRACT

An improved assembly for a computer that includes a motherboard having a first side and a second side. The first side has a first portion and a second portion. The first portion contains components capable of generating substantial heat and a strong electric field. The assembly further includes an EMI attenuating cover that encloses the first portion of the first side of the motherboard, but does not enclose the second portion of the first side of the motherboard.

17 Claims, 8 Drawing Sheets

PARTIALLY COVERED MOTHERBOARD WITH EMI PARTITION GATEWAY

FIELD OF THE INVENTION

The present invention relates to computer systems. More specifically, the invention relates to a partially covered motherboard having improved EMI and thermal characteristics.

BACKGROUND OF THE INVENTION

As personal computer components become more complex and powerful, they generate more heat and stronger electric fields. That heat must be effectively dissipated to prevent damage to the system. Those electric fields can cause electromagnetic interference ("EMI") that must be contained to prevent undesirable interference with other electronic equipment and to comply with various regulations—in particular, FCC imposed "open box" field strength limits.

A combination of various heat dissipation devices (e.g., heat sinks and heat spreaders) and forced convection apparatus (e.g., one of more fans) is conventionally used, when addressing the thermal issue. EMI containment is often handled by housing certain components in various types of metal casings, accompanied by appropriate gaskets and/or grounding mechanisms, and by using EMI emission absorbing chassis openings.

Current designs use many discrete components to manage EMI emission and heat dissipation, which may drive up system cost. In addition, many designs require throttled operation to keep EMI/heat generation from exceeding maximum thresholds, which degrades system performance.

Accordingly, there is a need for an improved assembly for a computer that provides a low cost integrated EMI/thermal management solution. There is a need for such an assembly that enables the system to operate at full power. The present invention provides such an assembly.

SUMMARY OF THE INVENTION

An improved assembly for a computer is disclosed. That assembly includes a motherboard having a first side and a second side. The first side has a first portion and a second portion. The first portion contains components capable of generating substantial heat and a strong electric field. The assembly further includes an EMI attenuating cover that encloses the first portion of the first side of the motherboard, but does not enclose the second portion of the first side of the motherboard.

DETAILED DESCRIPTION OF THE PRESENT INVENTION

An assembly for a computer is described. In the following description, numerous specific details are set forth such as material types, dimensions, etc., to provide a thorough understanding of the present invention. However, it will be apparent to those skilled in the art that the invention may be practiced in many ways other than those expressly described here. The invention is thus not limited by the specific details disclosed below.

Figure 1:
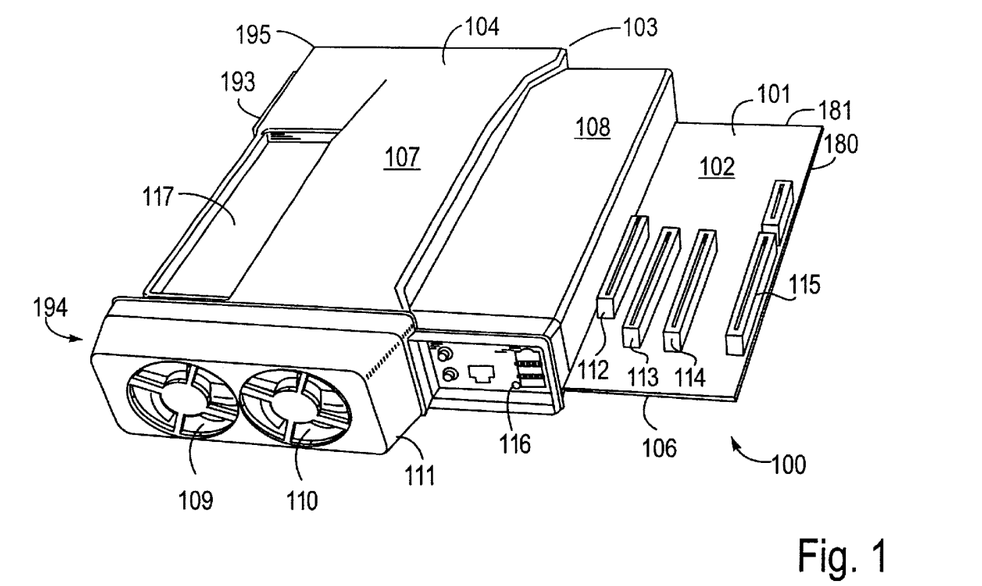
FIG. 1 is a perspective view of a first embodiment of the assembly for a computer of the present invention.
Figure 2:
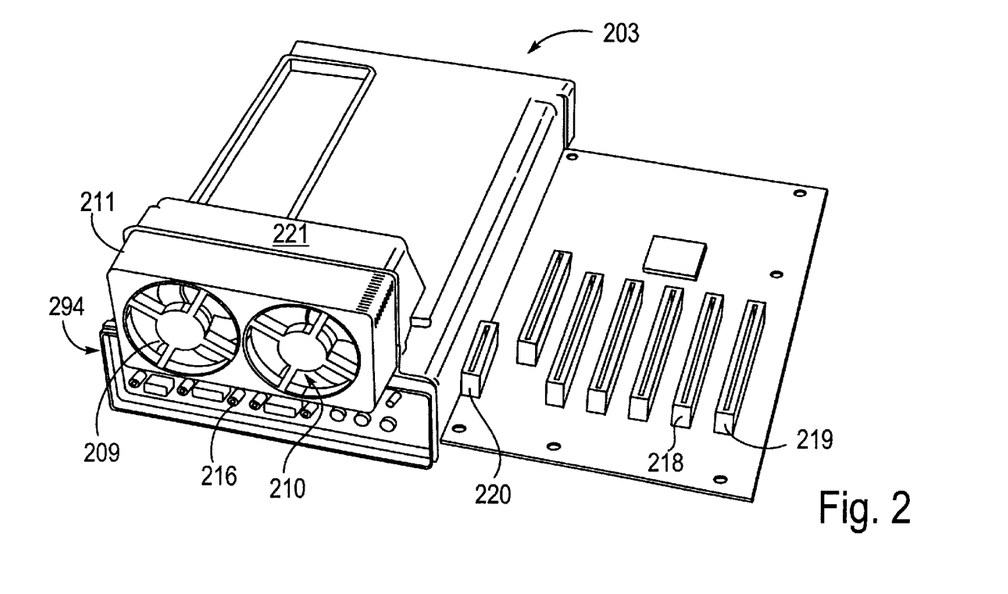
FIG. 2 is a perspective view of a second embodiment of the assembly for a computer of the present invention.

FIGS. 1 and 2 represent first and second embodiments of the assembly for a computer of the present invention. In the FIG. 1 embodiment, motherboard 100 has first side 101 and a second side (not shown). Motherboard 100 may be made from conventional materials in the conventional manner, as will be readily apparent to those skilled in the art. First side 101 has a first portion (not shown) and a second portion 102. The first portion contains components capable of generating substantial heat and a strong electric field, i.e., an electric field that exceeds the field strength limits specified in 47 CFR § 15.109. These limits are shown in Table 1 below.

TABLE 1

| Field Strength Limits for Unintentional Radiators at a Distance of 3 Meters | |
| --- | --- |
| Frequency of Emission (MHz) | Field Strength (microvolts/meter) |
| 30–88 | 100 |
| 88–216 | 150 |
| 216–960 | 200 |
| >960 | 500 |

In a preferred embodiment of the present invention, second portion 102 of first side 101 does not contain components capable of generating substantial heat and a strong electric field.

EMI attenuating cover 103 encloses the first portion of first side 101 of motherboard 100, but does not enclose second portion 102 of first side 101. Cover 103 comprises upper member 104 and may further comprise a lower member (not shown) that is connected to upper member 104. Alternatively, cover 103 may comprise upper member 104 only, which will be coupled to motherboard 100. When cover 103 comprises both upper and lower members, upper member 104 covers the components contained on the first portion of first side 101, while the lower member covers at least part of the second side of motherboard 100. Motherboard 100 preferably has a substantially rectangular shape with a pair of short edges (e.g., edge 180 and a similar short edge located opposite to edge 180, but obscured by cover 103) positioned substantially perpendicular to long edges 106 and 181. The short edges may each be about 9½ inches long and the long edges may each be about 12 inches long. In the embodiment shown in FIG. 1, cover 103 extends along the entire length of the short edge, but only along part of the length of long edges 106 and 181.

Cover 103 includes top 107 and sides 108 and 193. Sides 108 and 193 are oriented substantially perpendicular to long edges 106 and 181. Side 108 is sealed to motherboard 100 by an EMI attenuating seal (not shown). Side 193 is coupled with the lower member of cover 103 (e.g, by a tongue and groove combination or other connecting mechanism) to provide a seal for that side of the assembly.

Cover 103 is open at first and second ends 194, 195, which are oriented substantially parallel to long edges 106 and 181. EMI waveguides (not shown) are positioned at first and second ends 194, 195 of cover 103 for reducing EMI emissions through those open ends while enabling adequate airflow over the components that cover 103 encloses. As shown in FIG. 1, fans 109 and 110 are mounted within housing 111 for creating that airflow. Housing 111 may be snapped into place at first end 194 of cover 103. Fans 109 and 110 may draw air into second end 195 of cover 103, over the enclosed components, and out first end 194. Alternatively, fans 109 and 110 may force ambient air into the enclosed region, then out second end 195.

Standard 60 mm axial flow fans may be used for fans 109 and 110, although more or less powerful fans may be used depending upon the system's heat dissipation requirements. Similarly, although this embodiment shows two fans for cooling the system's core, a single fan or three or more fans may better match a particular system's cooling needs. In this regard, the assembly of the present invention enables cooling capacity to be scaled by simply adding more fans. Fans 109 and 110 preferably include a speed control capability that enables fan speed to be increased or decreased depending on system work load and ambient room temperature. Such a speed control feature may, for example, enable fans 109 and 110 to operate over an airflow range of 10–50 CFM and an acoustic level range of 30–40 db. When cover 103 includes upper and lower members, air may be uniformly drawn through the space enclosed by cover 103 over both the upper and lower sides of the motherboard.

Cover 103 includes movable section 117 that enables access to memory cards (not shown) that have been inserted into sockets mounted onto motherboard 100. Cover 103 may be made from magnesium using a thixomolding process. Such a process enables cover 103 to be shaped to funnel airflow over the processor heat s ink, and other core components with the greatest heat exchange requirement. Although magnesium is preferred, other materials, which block at least some of the EMI emissions generated by the components enclosed by the cover, may be used instead. Alternatively, cover 103 may be formed from aluminum based sheet metal, or sheet metal made from a rust resistant pre-plated galvanized steel.

The assembly shown in FIG. 1 includes AGP slot 112, for receiving a graphics card that conforms to the AGP specification, and 3 PCI slots 113–115, for receiving add-in cards that conform to the PCI specification. In addition, the assembly includes input/output panel 116. Panel 116 provides various input/output ports, such as one or more parallel and/or serial ports, and a number of sockets for receiving keyboard, cursor control device (e.g., a mouse), microphone, and/or speaker connections. Input/output panel 116 may also accommodate USB, 1394, RJ11 and/or RJ45 connectors. Panel 116 is located at first end 194 of cover 103, and adjacent to fans 109 and 110. In this embodiment, input/output panel 116 is positioned between fans 109 and 110 and second portion 102 of motherboard 100.

A second embodiment of the assembly for a computer, shown in FIG. 2, differs from the FIG. 1 embodiment by including two extra PCI slots 218 and 219 and additional slot 220 for receiving an audio/modem riser card. In addition, cover 203, unlike cover 103, includes a raised portion 221. Raised portion 221 permits fans 209 and 210 to be raised above input/output panel 216—located at first end 294 of cover 203 underneath fan housing 211.

Figure 3:
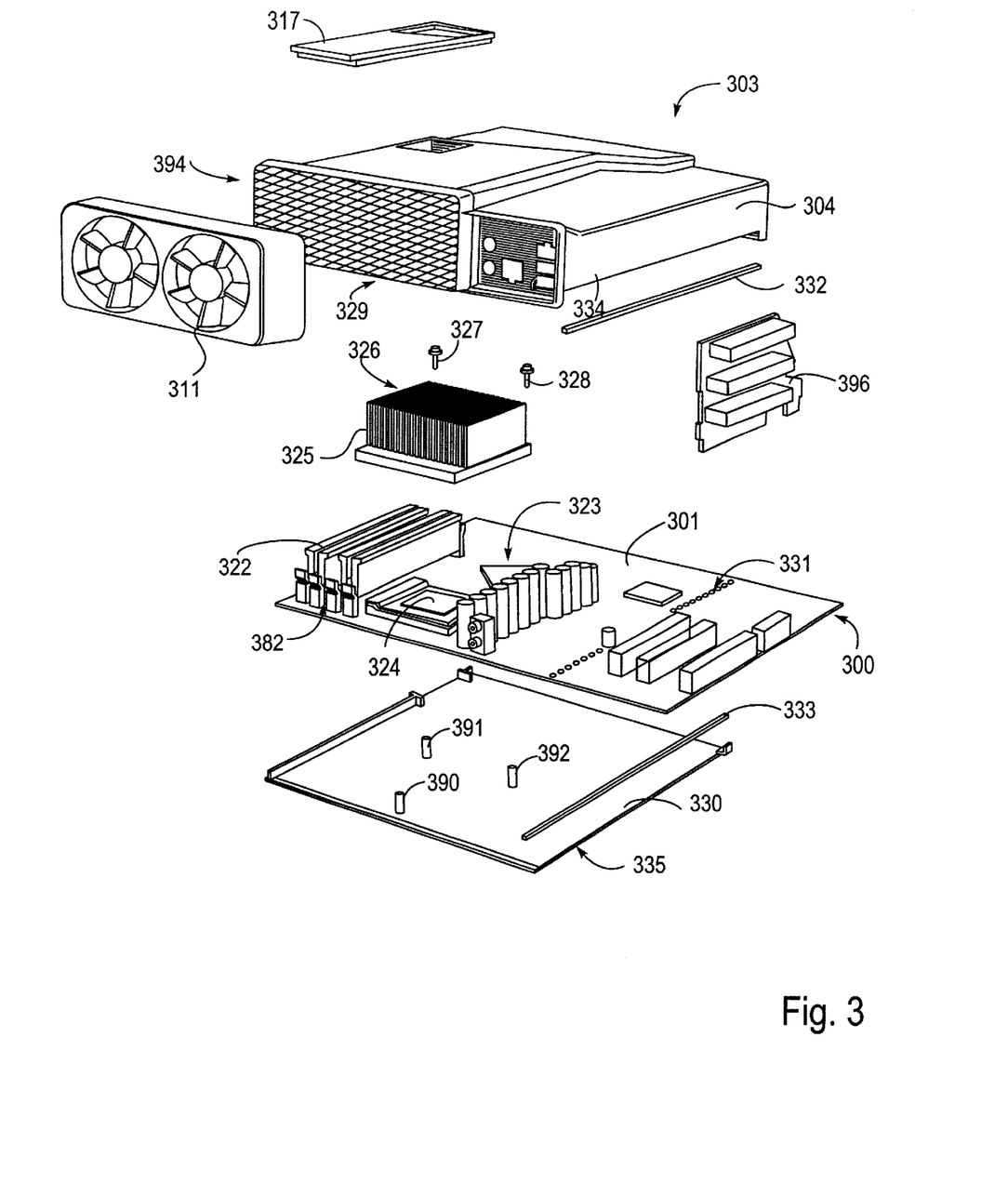
FIG. 3 is an exploded view of the embodiment of the assembly of the present invention shown in FIG. 1.

FIG. 3 provides an exploded view of the embodiment of the assembly of the present invention shown in FIG. 1. In that exploded view are shown processor 324 and memory 322, which in this embodiment comprise memory cards inserted into sockets 382 mounted on first portion 323 of first side 301 of motherboard 300. Upper member 304 will connect with lower member 330 to form an integrated assembly that will enclose those components. Lower member 330 may be made using the same material and process used to make upper member 304. Posts 390–392 are shown molded into lower member 330. Those posts will receive screws 326–328, which attach heat sink 325 to lower member 330. This is accomplished by passing screws 326–328 through holes formed in heat sink 325, then through holes formed in motherboard 300, for fastening to posts 390–392.

Directly mounting heat sink 325 to lower member 330 provides an EMI grounding function, while protecting the motherboard from excess structural loads. In addition, such a design causes heat transfer from heat sink 325 to lower member 330 via screws 326–328, which enables member 330 to function as a heat spreader. Heat sink 325 preferably is a folded fin heat sink, although other designs may be used instead. Similarly, although the illustrated post and screw assembly is preferred, heat sink 325 could be coupled to the assembly in other ways, e.g, by using standard retention clips.

Also shown in FIG. 3 is EMI waveguide 329 (shown mounted at first end 394 of cover 303) and movable section 317, shown removed from the remainder of cover 303. Rather than be completely removable from cover 303, movable section 317 could instead be mounted in a fixed fashion, e.g., by a hinge that permits movable section 317 to be swung open—enabling access to memory 322 without completely removing section 317 from cover 303. All other serviceable items, e.g., jumpers, cabling, etc. . . . , are preferably located outside of cover 303. When cover 303 is made of magnesium via a thixomolding process, waveguide mounting elements may be integrated into the cover for receiving waveguide 329.

Figure 4:
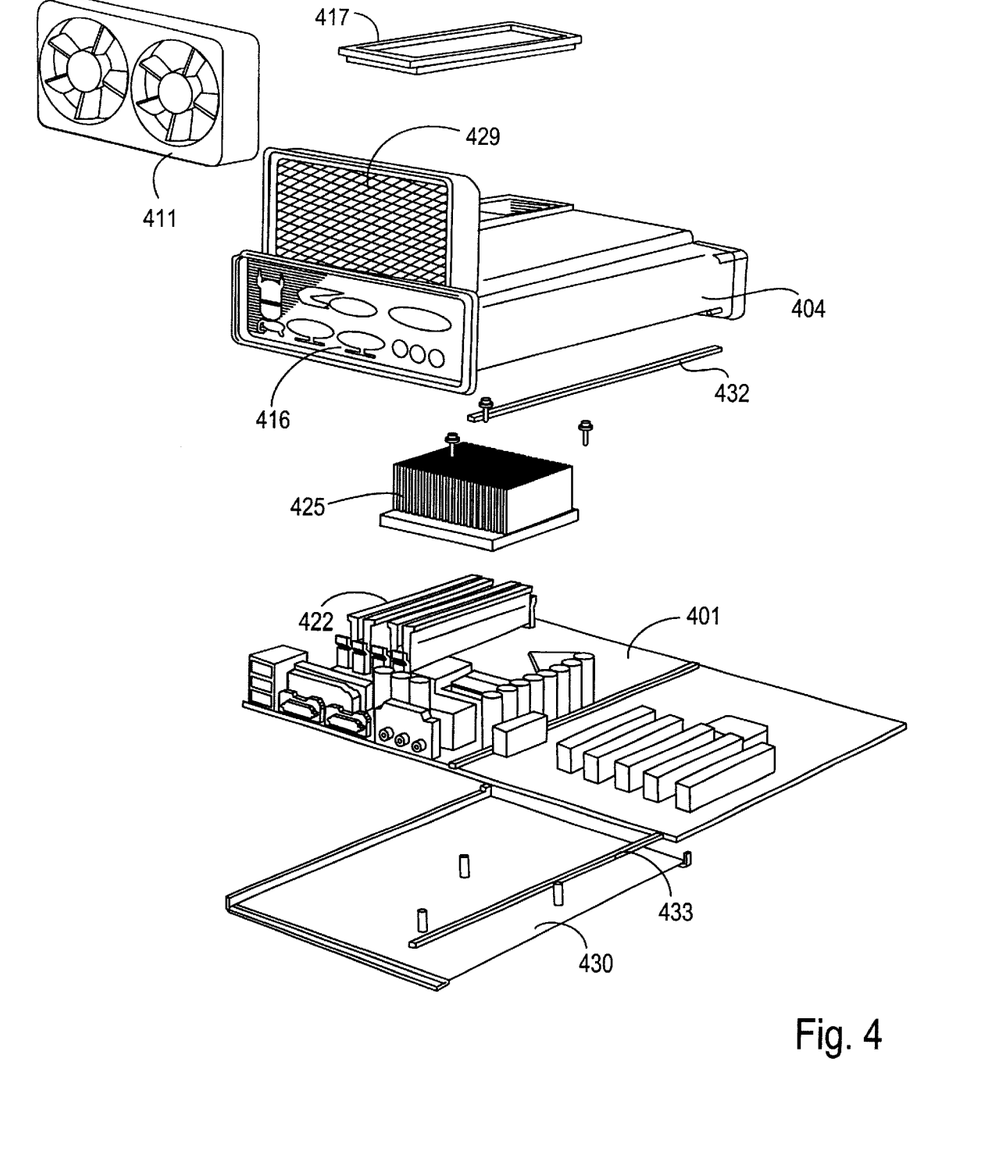
FIG. 4 is an exploded view of the embodiment of the assembly of the present invention shown in FIG. 2.

Upper perforated isolator tape 331 and a corresponding lower perforated isolator tape (not shown) are fixed to the first and second sides of motherboard 300, respectively. That tape may be made from various insulating materials that can electrically insulate traces (which will pass between first portion 323 and second portion 302) from EMI attenuating seals 332 and 333. Seals 332, 333 will receive edges 334 and 335, respectively, to seal those edges to motherboard 300. FIG. 3 further shows housing 311 for mounting fans to cover 303, and shows that PCI riser card 396 may be inserted into one of the PCI slots. FIG. 4 shows an exploded view for the embodiment of the assembly of the present invention shown in FIG. 2, in which EMI waveguide 429 is shown mounted above input/output panel 416.

Figure 5:
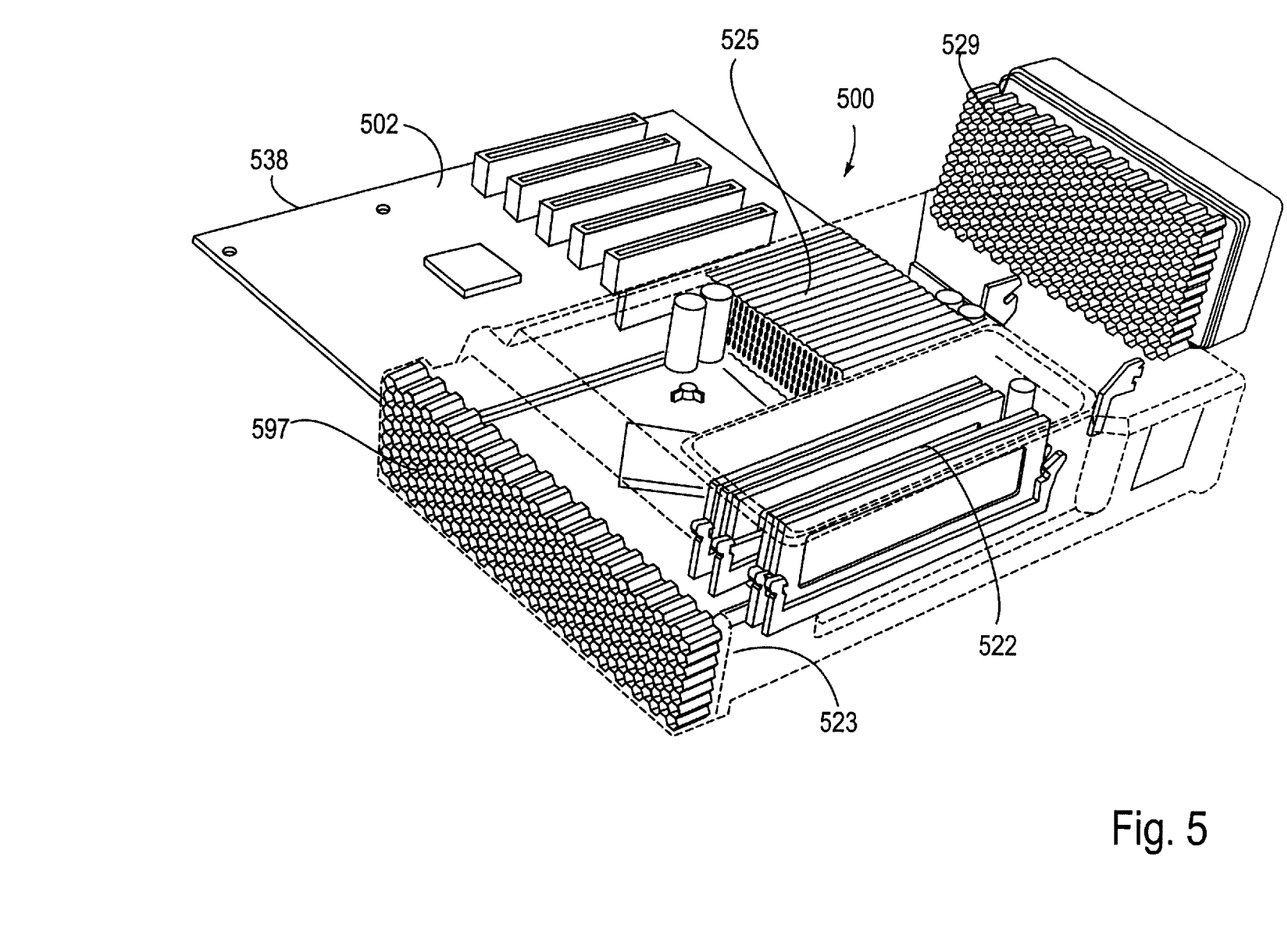
FIG. 5 is a perspective view of the embodiment shown in FIG. 2 as it would appear if the EMI attenuating cover was transparent.
Figure 6:
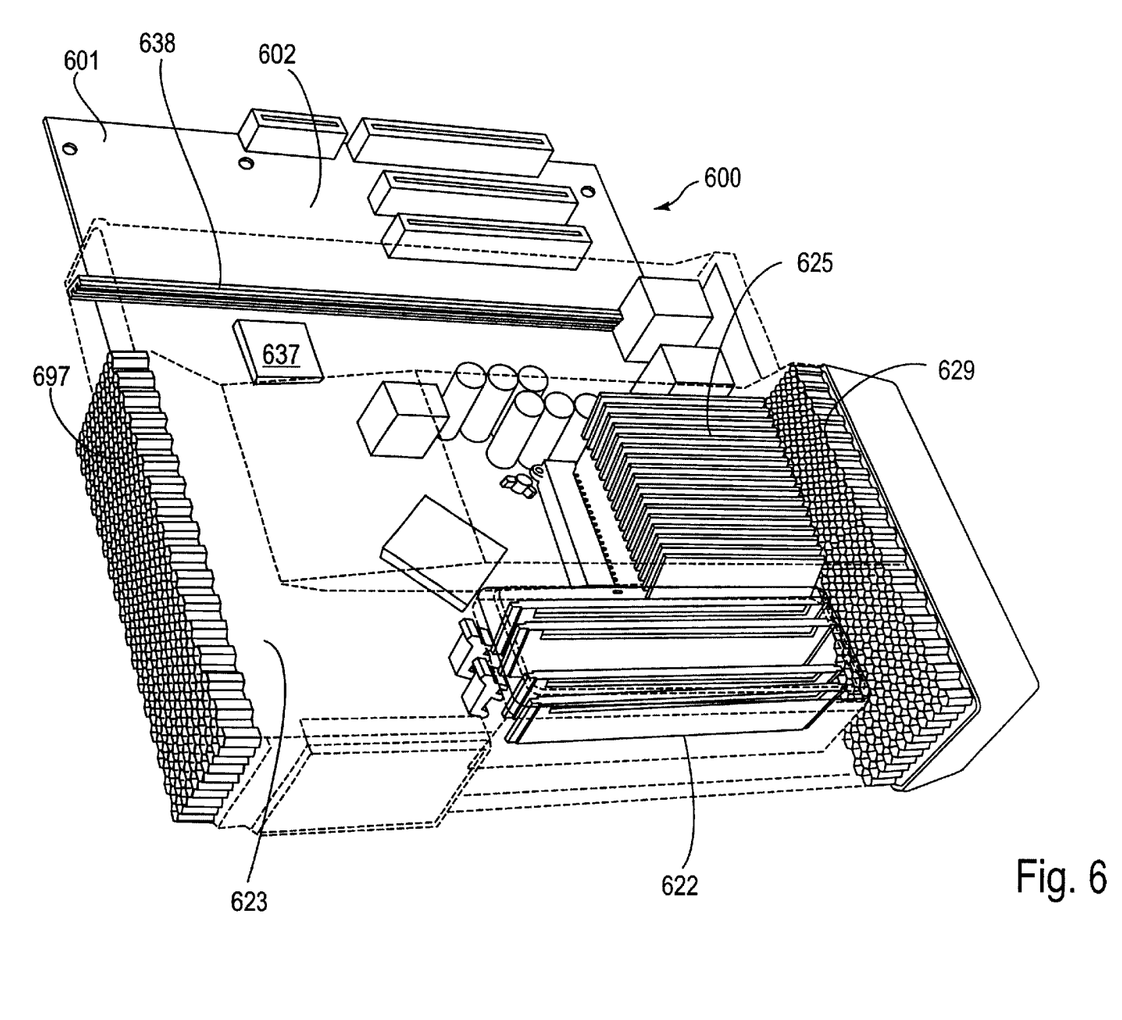
FIG. 6 is a perspective view of the embodiment shown in FIG. 1 as it would appear if the EMI attenuating cover was transparent.

FIGS. 5 and 6 provide perspective views of the embodiments shown in FIGS. 1 and 2 as they would appear if the EMI attenuating cover was transparent. FIG. 5 shows EMI waveguides 529 and 597 where they will be placed at the first and second ends of the EMI attenuating cover. Waveguides 529, 597 may be made from any material suitable for forming such a structure, such as, for example, anodized aluminum. The waveguides may be fixed to their respective ends of the cover using an electrically conductive epoxy, which provides good electrical contact between the waveguides and the cover.

In FIG. 5, heat sink 525 is shown covering the processor, which is enclosed within the cover along with memory 522. Waveguides 529, 597 ensure adequate airflow to remove heat from those components, while still serving to block EMI emissions. EMI partition gateway 538 seals first portion 523 from second portion 502 to reduce EMI emission leakage from the covered portion of motherboard 500 to the uncovered portion. The arrow shown in FIG. 5 represents airflow for an embodiment of the present invention in which the fans draw air through the enclosure, rather than push air into the enclosure.

FIG. 6 further shows memory controller 636 and input/output controller 637 mounted onto first side 601 of motherboard 600 within first portion 623. In this embodiment, air forced through the space that the cover encloses will remove heat from those components as well as from the other enclosed components, while the cover will block these additional components' EMI emissions. Thermal-acoustic performance for the embodiment shown in FIG. 6 should be improved over that of the FIG. 5 embodiment, as the raised fans and waveguide shown in FIG. 5 yield a less optimal airflow path through the enclosed space. That airflow path will increase cooling fan work requirements, resulting in higher fan speeds and acoustic dB levels, when compared to those that the FIG. 6 embodiment will require.

Figure 7:
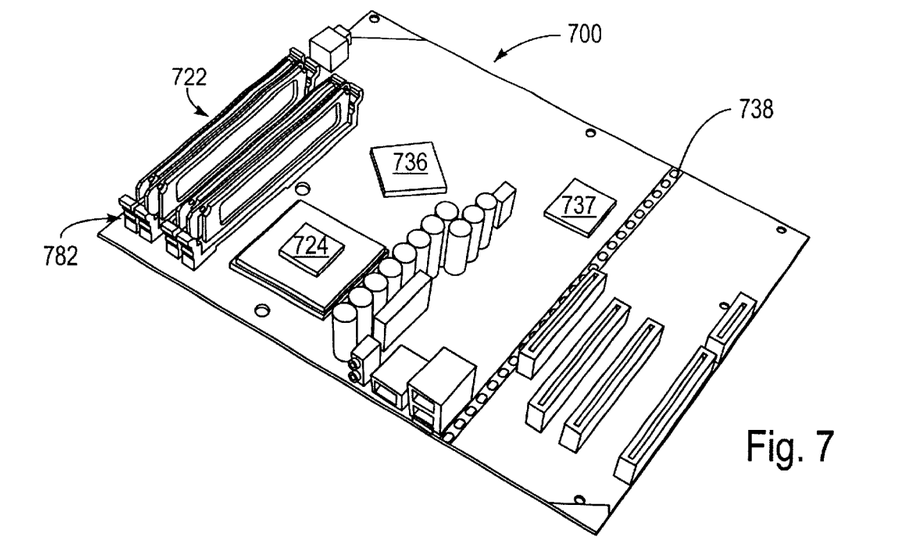
FIG. 7 is a surface view of a motherboard that may be included in the assembly of the present invention.

FIG. 7 provides a surface view of motherboard 700, which may be included in the assembly shown in FIGS. 1 and 3. Mounted to motherboard 700 are processor 724, chipset components 736 and 737, and sockets 782 that receive memory cards 722. The chipset components comprise the assembly's memory controller and input/output controller, respectively. Also shown in FIG. 7 is EMI gateway partition 738, the function of which will be described below.

Components are preferably positioned onto motherboard 700 to enable optimum airflow at the lowest cost. In this regard, filler blocks, baffles and other air direction devices may be placed onto the motherboard to route airflow for maximum heat exchange. In addition, various metal structures that are incorporated into the motherboard may assist with such heat transfer. Such metal features may take the form of metal plugs that pass through the motherboard, enabling heat to be conducted from one side of the motherboard to the other.

Figure 8:
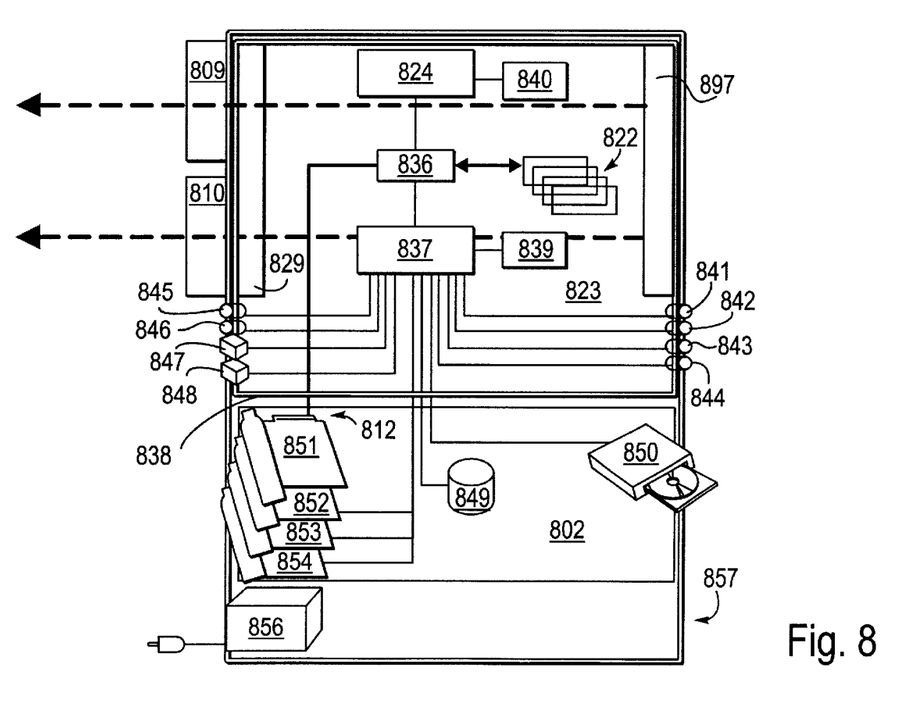
FIG. 8 is a schematic drawing illustrating components that may be included in an embodiment of the assembly of the present invention, and illustrating one way those components may be connected.

FIG. 8 provides a diagram showing how signals may be routed between various components and between first portion 823 and second portion 802. Most significant, from the standpoint of the present invention, is the presence of EMI gateway partition 838 that enables traces to pass between first portion 823 and second portion 802, without allowing significant EMI emission leakage.

As shown in FIG. 8, signals are routed between processor 824 and voltage regulator 840 and between processor 824 and memory controller 836. Signals also are transmitted between memory controller 836 and memory 822 and between memory controller 836 and input/output controller 837 (to which is coupled flash memory 839). Input/output ports 841–848, hard disk 849 and DVD-RAM 850 are shown coupled to input/output controller 837. Signals from the input/output ports are routed to controller 837 within first portion 823; whereas, signals passing between controller 837 and hard disk 849 or DVD-RAM 850 pass through EMI partition gateway 838. Signals transmitted between memory controller 836 and AGP card 851 (shown inserted into AGP slot 812) pass through partition gateway 838. Similarly, signals sent to and received from input/output controller 837 by PCI cards 852–854 (which will be inserted into their respective PCI slots) pass through partition gateway 838.

Also illustrated in the diagram are EMI waveguides 829 and 897, fans 809 and 810, power supply 856 and chassis 857, with arrows reflecting an embodiment of the present invention where air is pulled through the system core by fans 809 and 810. When the cover is placed over first portion 823, the assembly forms a faraday cage for trapping EMI emissions that the components coupled to this portion of the motherboard generate. Chassis 857 likewise will form a faraday cage, which will enclose the entire motherboard, power supply 856 and other components housed within the chassis.

Figure 9:
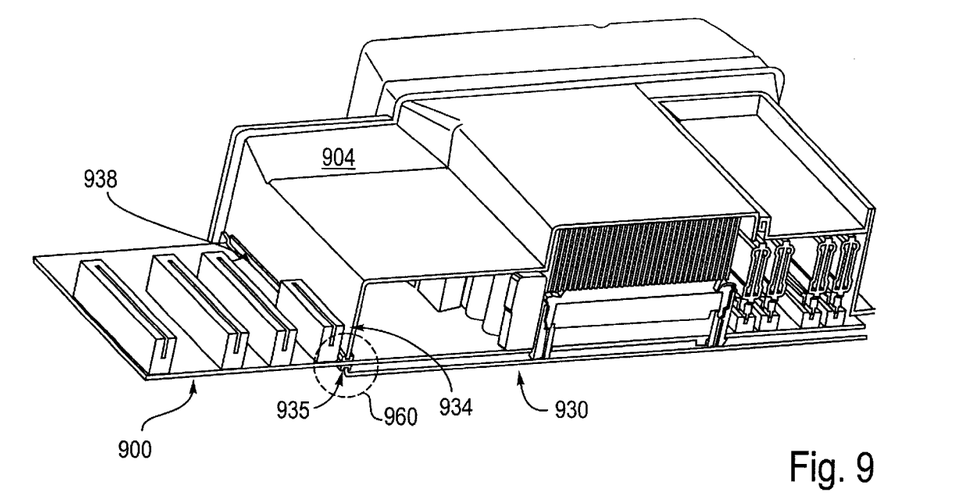
FIG. 9 is a perspective view of a cross-section of the assembly of the present invention shown in FIG. 1.

FIG. 9 is a perspective view of a cross-section of the assembly of the present invention shown in FIG. 1, as seen from the backside of the assembly. Section 960 reflects a cross-section through EMI partition gateway 938, where edge 934 of upper member 904 and edge 935 of lower member 930 are sealed with respect to motherboard 900.

Figure 10:
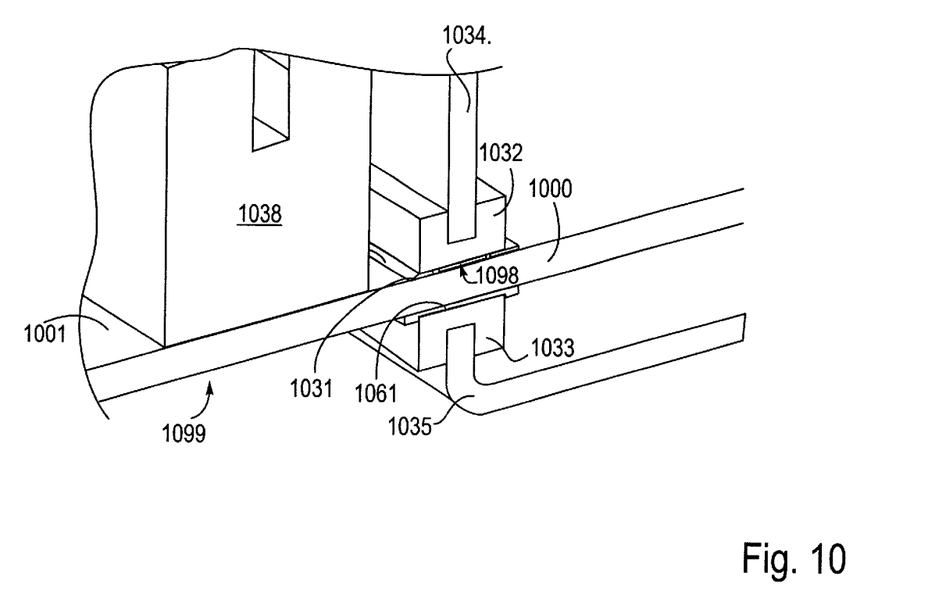
FIG. 10 is an enlarged view of a portion of the cross-section shown in FIG. 9.

FIG. 10 is an enlarged view of section 960. That enlarged view shows EMI seals 1032, 1033 located above and below motherboard 1000, respectively. Upper perforated isolator tape 1031 and lower perforated isolator tape 1061 are sandwiched between EMI seal 1032 and motherboard 1000 and between EMI seal 1033 and motherboard 1000, respectively. EMI seals 1032 and 1033 reduce EMI emission leakage from the space enclosed within the EMI attenuating cover by sealing edges 1034 and 1035 with motherboard 1000. Seals 1032, 1033 preferably comprise an elastic foam gasket, such as one made from a polyurethane foam. That gasket should include a sufficient amount of a conductive material, e.g. a metal mesh, to provide good electrical contact between edges 1034, 1035 and motherboard 1000. In addition to their EMI emission retardation function, seals 1032, 1033 may help prevent fan driven air from leaking out of the enclosed space through gaps located between edges 1034, 1035 and motherboard 1000.

Although this EMI sealing function is desired, it is also desirable to enable traces to traverse this barrier. To accommodate that feature, perforated isolator tape 1031, 1061 is attached to motherboard 1000. The solid portions of the tape will cover the traces, insulating them from the EMI seals. The perforated portions of the tape enable stitch pads, which are mounted to the motherboard, to pass through the tape for contact with the EMI seals. FIG. 10 shows a cross-section of stitch pad 1098—in this embodiment comprising a small piece of conducting material fixed to the motherboard. Many such stitch pads may be formed on both first side 1001 and second side 1099. In a preferred embodiment, the stitch pads formed on side 1001 may be staggered with respect to those formed on side 1099. Traces traversing EMI gateway partition 1038 can be routed between the stitch pads, i.e., routed where the solid portions of tape 1031, 1061 cover motherboard 1000. The EMI partition gateway thus provides a low cost mechanism for routing traces across a faraday cage partition.

Figure 11:
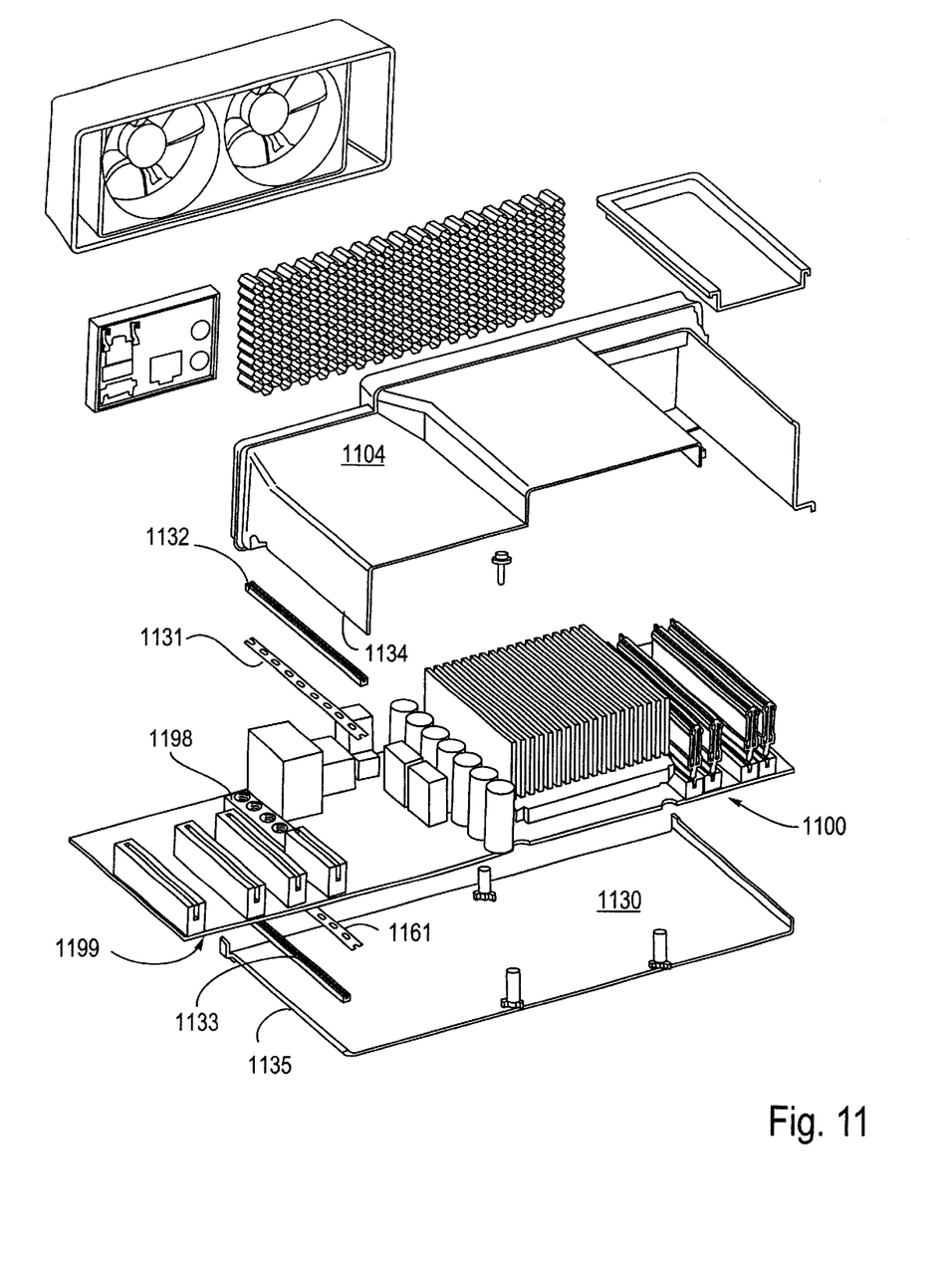
FIG. 11 is an exploded view of the cross-section shown in FIG. 9.

FIG. 11, an exploded view of the cross-section shown in FIG. 9, shows in more detail how the stitch pads, tape and seals are assembled to form the EMI partition gateway. EMI seal 1133 engages edge 1135 of lower member 1130. Lower perforated isolator tape 1161 engages EMI seal 1133, and is fixed to second side 1199 of motherboard 1100. Tape 1161 perforations will slip over stitch pads (not shown) formed on second side 1199, when attaching tape 1161 to that side of the motherboard. Solid portions of the tape will cover traces formed on side 1199, insulating them from seal 1133. EMI seal 1133 will be electrically coupled to the stitch pads.

On the upper side of motherboard 1100 are formed stitch pads 1198. Stitch pads 1198 will pass through the perforated portions of upper perforated isolator tape 1131 as tape 1131 is slipped over pads 1198, when attaching tape 1131 to that side of the motherboard. In a preferred embodiment, stitch pads 1198 and tape 1131 have substantially the same thickness, enabling EMI seal 1132 to contact either stitch pads 1198 (i.e., where tape 1131 is perforated) or the solid portions of the tape, when EMI seal 1132 is put into place. EMI seal 1132 completes the EMI sealing structure by receiving edge 1134 of upper member 1104. The stitch pads enable the EMI seals to be grounded to the motherboard.

An improved assembly for a computer has been described. This assembly provides an integrated solution for managing the excessive heat and strong electric field that certain components may generate. The EMI attenuating cover fully encloses the system's core components, providing both an economical core faraday cage and an isolated cooling partition. By using relatively few relatively simple parts, the assembly of the present invention provides a low cost, easy to assemble, solution for EMI/thermal management, which may be optimized to enable unthrottled performance.

Features shown in the above referenced drawings are not intended to be drawn to scale, nor are they intended to be shown in precise positional relationship. Additional components that may be included in the assembly have been omitted as they are not useful to describe aspects of the present invention. Although the foregoing description has specified an assembly for a computer that includes certain features, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. An assembly for a computer comprising:
    a motherboard having a first side and a second side, the first side having a first portion and a second portion, the first portion containing components capable of generating substantial heat and a strong electric field;
    an EMI attenuating cover that encloses the first portion of the first side of the motherboard, but does not enclose the second portion of the first side of the motherboard; and
    an EMI partition gateway for routing traces from the first portion of the first side of the motherboard to the second portion of the first side of the motherboard without causing significant EMI emissions.

2. The assembly of claim 1 wherein the second portion of the first side of the motherboard does not contain components capable of generating substantial heat and a strong electric field.

3. The assembly of claim 2 wherein the cover comprises upper and lower members, the upper member covering the components contained on the first portion of the first side of the motherboard, and the lower member covering at least part of the second side of the motherboard.

4. The assembly of claim 3 wherein the components contained on the first portion of the first side of the motherboard comprise a processor, a chipset component, and memory.

5. The assembly of claim 4 wherein the motherboard has a substantially rectangular shape with a short edge and a long edge, and wherein the cover extends along the entire length of the short edge, but only along part of the length of the long edge.

6. The assembly of claim 5 wherein the cover comprises a top and two sides, the two sides oriented substantially perpendicular to the long edge of the motherboard with one of those sides sealed to the motherboard by an EMI seal, the cover open at first and second ends, the first and second ends oriented substantially parallel to the long edge of the motherboard.

7. The assembly of claim 6 further comprising a fan positioned at the first end of the cover.

8. The assembly of claim 7 further comprising EMI waveguides positioned at the first end and the second end.

9. The assembly of claim 1 wherein the EMI partition gateway comprises EMI stitch pads located adjacent to the traces.

10. The assembly of claim 9 wherein EMI stitch pads are located on both the first side and the second side of the motherboard, the stitch pads on the first side staggered with respect to the stitch pads on the second side.

11. The assembly of claim 10 further comprising an AGP slot and at least one PCI slot located on the second portion of the first side of the motherboard.

12. The assembly of claim 11 further comprising at least one connector for connecting peripheral devices to the assembly, the at least one connector located adjacent to the fan at the first end of the cover.

13. The assembly of claim 12 wherein the connector is located between the fan and the second portion of the first side of the motherboard.

14. An assembly for a computer comprising:
    a substantially rectangular motherboard having a short edge and a long edge and having a first side and a second side, the first side having a first portion and a second portion, wherein a processor, a chipset component, and memory are connected to the first portion of the first side of the motherboard;
    a cover that encloses the first portion of the first side of the motherboard, but does not enclose the second portion of the first side of the motherboard, the cover extending along the entire length of the short edge, but only along part of the length of the long edge, the cover comprising:
        a top and two sides, the two sides oriented substantially perpendicular to the long edge of the motherboard with one of those sides sealed to the motherboard by an EMI seal, the cover open at first and second ends, the first and second ends oriented substantially parallel to the long edge of the motherboard;
    EMI waveguides positioned at the first end and the second end of the cover; and
    an EMI partition gateway for routing traces from the first portion of the first side of the motherboard to the second portion of the first side of the motherboard without causing significant EMI emissions, the EMI partition gateway comprising EMI stitch pads located adjacent to the traces and located on both the first side and the second side of the motherboard, the stitch pads on the first side staggered with respect to the stitch pads on the second side.

15. The assembly of claim 14 further comprising:
    a fan positioned at the first end of the cover;
    an AGP slot and at least one PCI slot located on the second portion of the first side of the motherboard; and
    at least one connector for connecting peripheral devices to the assembly, the at least one connector located at the first end of the cover between the fan and the second portion of the first side of the motherboard.

16. The assembly of claim 14 wherein the cover includes a movable section that enables access to the memory.

17. An assembly for a computer comprising:
   a substantially rectangular motherboard having a short edge and a long edge and having a first side and a second side, the first side having a first portion and a second portion, wherein a processor, a chipset component, and memory are connected to the first portion of the first side of the motherboard;
   a cover that encloses the first portion of the first side of the motherboard, but does not enclose the second portion of the first side of the motherboard, the cover extending along the entire length of the short edge, but only along part of the length of the long edge, the cover comprising:
      a top and two sides, the two sides oriented substantially perpendicular to the long edge of the motherboard with one of those sides sealed to the motherboard by an EMI seal, and the top having a movable section that lies above the memory that can be opened to enable access to the memory, wherein the cover is open at first and second ends, the first and second ends oriented substantially parallel to the long edge of the motherboard;
   a fan positioned at the first end of the cover;
   an AGP slot and at least one PCI slot located on the second portion of the first side of the motherboard;
   at least one connector for connecting peripheral devices to the assembly, the at least one connector located at the first end of the cover and located beneath the fan;
   EMI waveguides positioned at the first end and the second end of the cover; and
   an EMI partition gateway for routing traces from the first portion of the first side of the motherboard to the second portion of the first side of the motherboard without causing significant EMI emissions, the EMI partition gateway comprising EMI stitch pads located adjacent to the traces, the stitch pads being located on both the first side and the second side of the motherboard, the stitch pads on the first side staggered with respect to the stitch pads on the second side.

* * * * *